(12) United States Patent
Lin et al.

(10) Patent No.: US 9,153,528 B2
(45) Date of Patent: Oct. 6, 2015

(54) CHIP PACKAGE AND METHOD FOR FORMING THE SAME

(71) Applicant: XINTEC INC., Jhongli, Taoyuan County (TW)

(72) Inventors: Po-Shen Lin, New Taipei (TW); Tsang-Yu Liu, Zhubei (TW); Yen-Shih Ho, Kaohsiung (TW); Chih-Wei Ho, Zhongli (TW); Yu-Min Liang, Zhongli (TW)

(73) Assignee: XINTEC INC., Taoyuan (TW)

( * ) Notice: Subject to any disclaimer, the term of this patent is extended or adjusted under 35 U.S.C. 154(b) by 69 days.

(21) Appl. No.: 13/898,300

(22) Filed: May 20, 2013

(65) Prior Publication Data

US 2013/0307137 A1    Nov. 21, 2013

Related U.S. Application Data

(60) Provisional application No. 61/649,870, filed on May 21, 2012.

(51) Int. Cl.
| | |
|---|---|
| H01L 21/78 | (2006.01) |
| H01L 23/498 | (2006.01) |
| H01L 23/00 | (2006.01) |
| B81B 7/00 | (2006.01) |
| H01L 27/146 | (2006.01) |

(52) U.S. Cl.
CPC ............ *H01L 23/498* (2013.01); *B81B 7/0077* (2013.01); *H01L 21/78* (2013.01); *H01L 24/94* (2013.01); *H01L 27/14618* (2013.01); *H01L 2924/1306* (2013.01); *H01L 2924/13091* (2013.01); *H01L 2924/1461* (2013.01)

(58) Field of Classification Search
CPC ....... H01L 31/00; H01L 23/48; H01L 23/498; H01L 31/0203
USPC ......... 257/734, 774, 434, 775, 779, 780, 781, 257/784, 748
See application file for complete search history.

(56) References Cited

U.S. PATENT DOCUMENTS

| | | | |
|---|---|---|---|
| 2008/0290438 A1* | 11/2008 | Weng et al. | 257/434 |
| 2012/0112329 A1 | 5/2012 | Yen et al. | |
| 2013/0119556 A1* | 5/2013 | Liu et al. | 257/774 |
| 2013/0341747 A1* | 12/2013 | Lin et al. | 257/432 |

* cited by examiner

*Primary Examiner* — Choung A Luu
(74) *Attorney, Agent, or Firm* — Liu & Liu

(57) ABSTRACT

Embodiments of the present invention provide a chip package including: a semiconductor substrate having a first surface and a second surface; a device region formed in the semiconductor substrate; a dielectric layer disposed on the first surface; and a conducting pad structure disposed in the dielectric layer and electrically connected to the device region; a cover substrate disposed between the chip and the cover substrate, wherein the spacer layer, a cavity is created an surrounded by the chip and the cover substrate on the device region, and the spacer layer is in direct contact with the chip without any adhesion glue disposed between the chip and the spacer layer.

27 Claims, 10 Drawing Sheets

CHIP PACKAGE AND METHOD FOR FORMING THE SAME

CROSS REFERENCE TO RELATED APPLICATIONS

This application claims the benefit of U.S. Provisional Application No. 61/649,870 filed on May 21, 2012, entitled "Chip package and method for forming the same," which application is hereby incorporated herein by reference.

BACKGROUND OF THE INVENTION

1. Field of the Invention

The invention relates to a chip package and a method for forming the same, and in particular, relates to a chip package formed by using a wafer-level packaging process.

2. Description of the Related Art

The chip package packaging process is one important step when forming electronic products. A chip package not only provides protection for the chips from environmental contaminants, but also provides a connection interface for electronic elements therein and chips packaged therein.

Because the conventional chip packaging process is complicated, a simplified chip packaging process is desired.

BRIEF SUMMARY OF THE INVENTION

According to an illustrative embodiment of the invention, a chip package includes: a chip, comprising: a semiconductor substrate having a first surface and a second surface; a device region formed in the semiconductor substrate; a dielectric layer disposed on the first surface; and a conducting pad structure disposed in the dielectric layer and electrically connected to the device region; a cover substrate disposed on the chip; and a spacer layer disposed between the chip and the cover substrate, wherein a cavity is created and surrounded by the spacer layer, the chip and the cover substrate on the device region, and wherein the spacer layer directly contacts the chip, and no adhesion glue is disposed between the chip and the spacer layer.

According to another illustrative embodiment of the invention, a method for forming a chip package includes: providing a wafer, comprising: a semiconductor substrate having a first surface and a second surface; a plurality of device regions formed in the semiconductor substrate; a dielectric layer disposed on the first surface; and a plurality of conducting pad structures disposed in the dielectric layer, where each of the conducting pad structures is electrically connected to one of the device regions, respectively; providing a cover substrate; forming a spacer layer on the wafer or the cover substrate; mounting the cover substrate onto the wafer such that the spacer layer is located between the wafer and the cover substrate, wherein a plurality of cavities is created and surrounded by the spacer layer, the wafer and the cover substrate, and each of the cavities is located over one of the regions, respectively, and wherein the spacer layer directly contacts the wafer, and there is no adhesion glue disposed between the wafer and the spacer layer; and performing a dicing process along a plurality of predetermined scribe lines of the wafer for forming a plurality of separated chip packages.

A detailed description is given in the following embodiments with reference to the accompanying drawings.

BRIEF DESCRIPTION OF THE DRAWINGS

The present invention can be further understood by reading the subsequent detailed description and examples with references made to the accompanying drawings, wherein.

DETAILED DESCRIPTION OF THE INVENTION

The manufacturing method and method for use of the embodiment of the invention are illustrated in detail as follows. It is understood, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in dictate a relationship between the various embodiments and/or configurations discussed. Furthermore, descriptions of a first layer "on," "overlying," (and like descriptions) a second layer, include embodiments where the first and second layers are in direct contact and those where one or more layers are interposing the first and second layers.

A chip package according to an embodiment of the present invention may be used to package a variety of chips. For example, the chip package of the embodiments of the invention may be applied to active or passive elements, or electronic components with digital or analog circuits, such as opto electronic devices, micro electro mechanical systems (MEMS), micro fluidic systems, and physical sensors for detecting the physical quantity variation of heat, light, or pressure. Particularly, a wafer scale package (WSP) process may be applied to package semiconductor chips such as image sensor devices, light-emitting diodes (LEDs), solar cells, RF circuits, accelerators, gyroscopes, micro actuators, surface acoustic wave devices, pressure sensors, ink printer heads, or power MOSFET modules.

The wafer scale package process mentioned above mainly means that after the package process is accomplished during the wafer stage, the wafer with chips is cut to independent packages. However, in a specific embodiment, separated chips may be redistributed overlying a supporting wafer and then be packaged, which may also be referred to as a wafer scale package process. In addition, the above mentioned wafer scale package process may be also adapted to form chip packages of multi-layer integrated circuit devices by stacking a plurality of wafers having integrated circuits. In one embodiment, the diced package is a chip scale package (CSP). The size of the chip scale package (CSP) may be only slightly larger than the size of the packaged chip. For example, the size of the chip package is not larger than 120% of the size of the packaged chip.

Figure 1A:
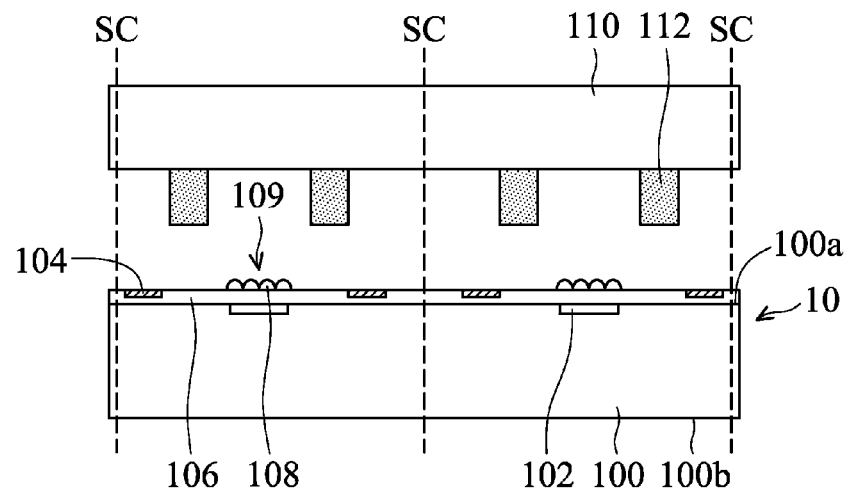
FIGS. 1A-1F show cross-sectional views of the formation of a chip package according to an embodiment of the present invention.

FIGS. 1A-1F show cross-sectional views of the formation of a chip package according to an embodiment of the present invention. As shown in FIG. 1A, a wafer 10 is provided. The wafer 10 may be a semiconductor wafer, such as a silicon wafer. The wafer 10 may comprise a semiconductor substrate 100 having a first surface 100a and a second surface 100b. The wafer 10 may have a plurality of predetermined scribe lines SC. The wafer 10 may also have a plurality of device regions formed in the semiconductor substrate 100. There are various devices, such as an opto electronic device, formed in the device regions 102. The opto electronic device may be an image sensor device or an illuminating device.

The wafer 10 may further comprise a dielectric layer 106 disposed on the surface 100a of the semiconductor substrate 100 and a plurality of conducting pad structures 104 disposed in the dielectric layer 106. Each of the conducting pad structures 104 electrically connects to one of the device regions 102, respectively. In an embodiment, an optical element 108 may be optionally formed in the device regions 102. The optical element 108 may comprise a lens/or a color filter layer.

Then, a cover substrate 110 is provided. The cover substrate 110 may have a size and profiles similar to the size and profiles of the wafer 10. The cover substrate 110 may be a transparent substrate, such as a glass substrate. In an embodiment, the cover substrate 110 may be an IR glass substrate.

Then, a spacer layer 112 may be formed on the wafer 10 or the cover substrate 110. In the embodiment shown in FIG. 1, the spacer layer 112 is formed on the cover substrate 110. The material of the spacer layer 112 may comprise (but is not limited to) an epoxy resin, a silicon gel polymer, or a combination thereof. In an embodiment, the spacer layer 112 may be adhesive itself and can directly bond onto the cover substrate 110 or the wafer 10. In addition, the spacer layer 112 may be cured using a curing process, such as a heating process and/or an illuminating process. In an embodiment, the spacer layer 112 comprises a photoresist material and is able to be patterned by exposure and development processes.

For example, in an embodiment, a spacer material layer (not shown) may be formed on the cover substrate 110 using a spray coating process or a spin coating process. Then, exposure and development processes may be performed to the spacer material layer for patterning the spacer material layer as the spacer layer 112 shown in FIG. 1A. In another embodiment, the steps of forming the spacer layer 112 may comprise performing multiple deposition, exposure, and development processes, for forming a stack of a plurality of patterned material layers. In this case, the spacer layer 112 may comprise a stack of a plurality of patterned material layers. These material layers may comprise the same material and have interfaces therebetween. In an embodiment, the interfaces may be detected by optical measurement or observed by electronic microscopy. In another embodiment, the materials of the material layers are not completely the same.

Figure 1B:
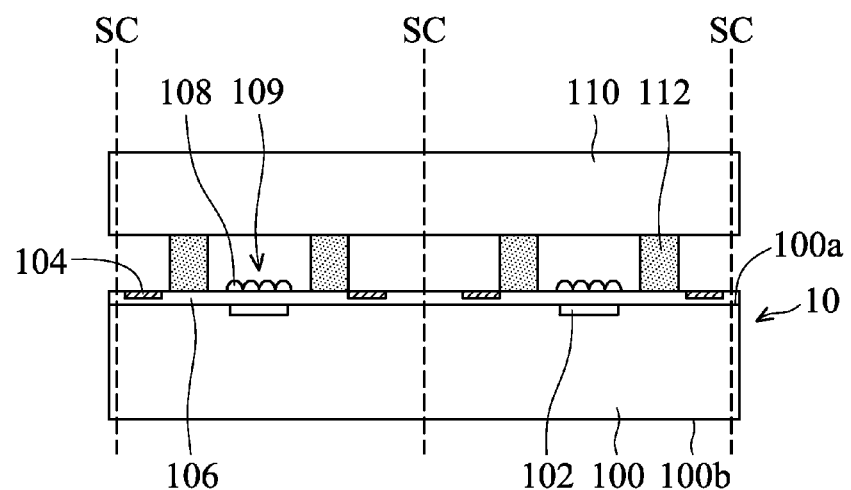

Then, as shown in FIG. 1B, the cover substrate 110 is mounted on the wafer 10 such that the spacer layer is located between the wafer 10 and the cover substrate 110. In an embodiment, the spacer layer 112 may be bonded to the wafer 10 since the spacer layer 112 is adhesive. Then, the spacer layer 112 may be optionally cured. Cavities 109 may be created and surrounded by the spacer layer 112, the wafer 10 and the cover substrate 110. Each of the cavities 109 may be located over one of the device regions 102, respectively. The optical element 108 may be located in the cavities 109. The spacer layer 112 may directly contact the wafer 10, and no adhesion glue is disposed between the spacer layer 112 and the wafer 10. In an embodiment, the wafer 10 may comprise an optical layer (not shown, such as a color filter layer) on the semiconductor substrate 100 or a flat layer (not shown) on the semiconductor substrate 100. In this case, the spacer layer 112 may directly contact the semiconductor substrate 100, the dielectric layer 106, the optical layer on the semiconductor substrate 100, or the flat layer on the semiconductor substrate 100. Since there is no adhesion glue disposed at the two ends of the spacer layer 112, displacement between the semiconductor substrate 100 and the cover substrate 110 may be prevented. In addition, the optical element 108 on the device region 102 may be also prevented from being contaminated by the adhesion glue.

Figure 5A:
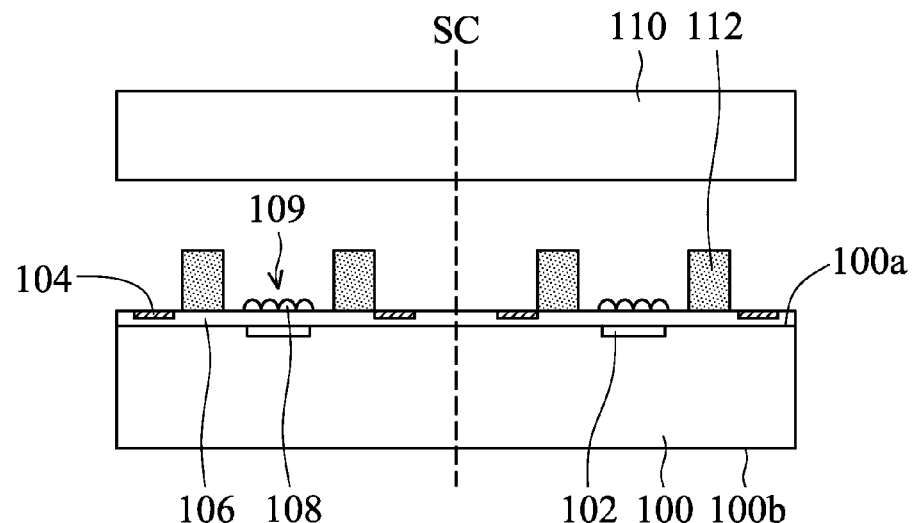
FIGS. 5A-5B show cross-sectional views of the formation of a chip package according to an embodiment of the present invention.
Figure 5B:
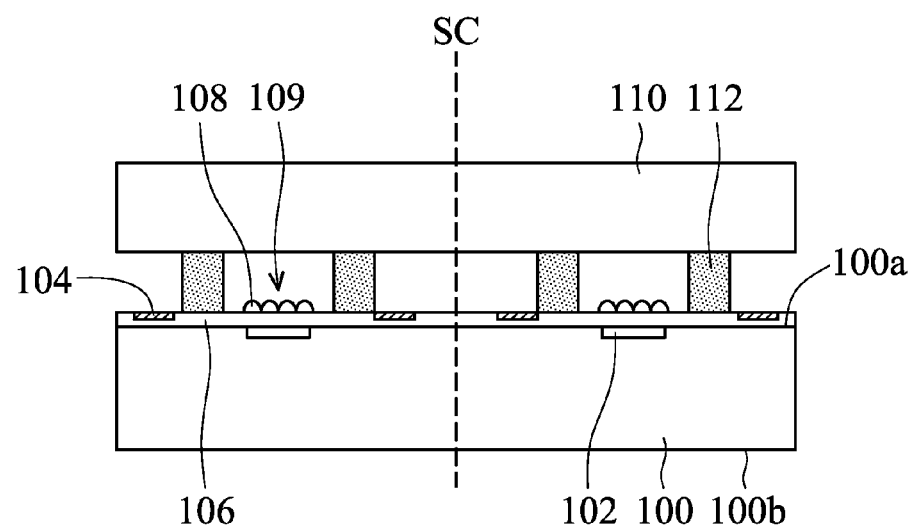

The embodiments of the present invention are not limited to this. In another embodiment, as shown in FIGS. 5A-5B, the spacer layer 112 is formed on the wafer 10 first. Then, the cover substrate 110 may be bonded onto the spacer layer 112.

As shown in FIG. 1B, in an embodiment, the projection of the spacer layer 112 on the surface 100a is located between the projection of the conducting pad structures 104 on the surface 100a and the projection of the device regions 102 on the surface 100a. In an embodiment, the projection of the spacer layer 112 on the surface 100a does not overlap the projection of the conducting pad structures 104 on the surface 100a. That is, the spacer layer 112 is not right above the conducting pad structures 104.

Figure 1C:
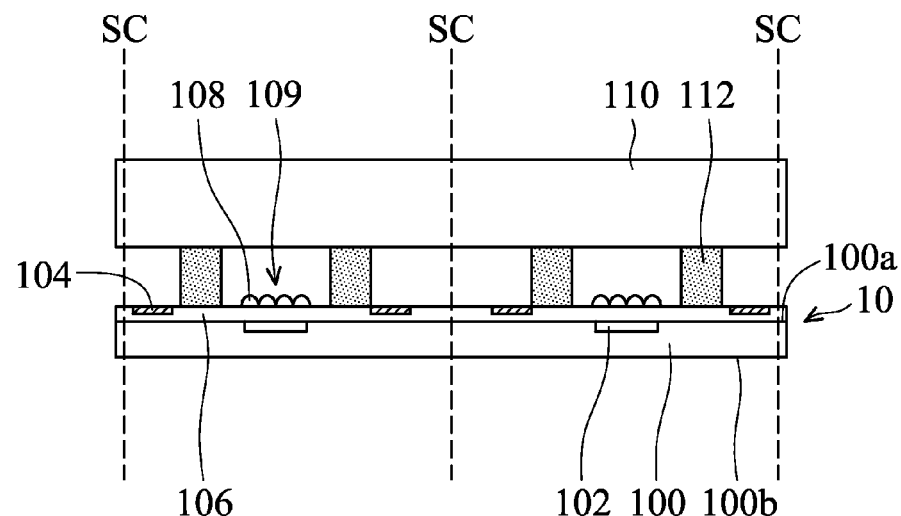

As shown in FIG. 1C, the wafer 10 may then be optionally thinned. For example, a thinning process may be performed to the surface 100b of the semiconductor substrate 100 by using the cover substrate 110 as a support, for thinning the semiconductor substrate 100 to a suitable thickness. The suitable thinning process may be a mechanical polishing process, an etching process, a chemical mechanical polishing process, or a combination thereof.

Figure 1D:
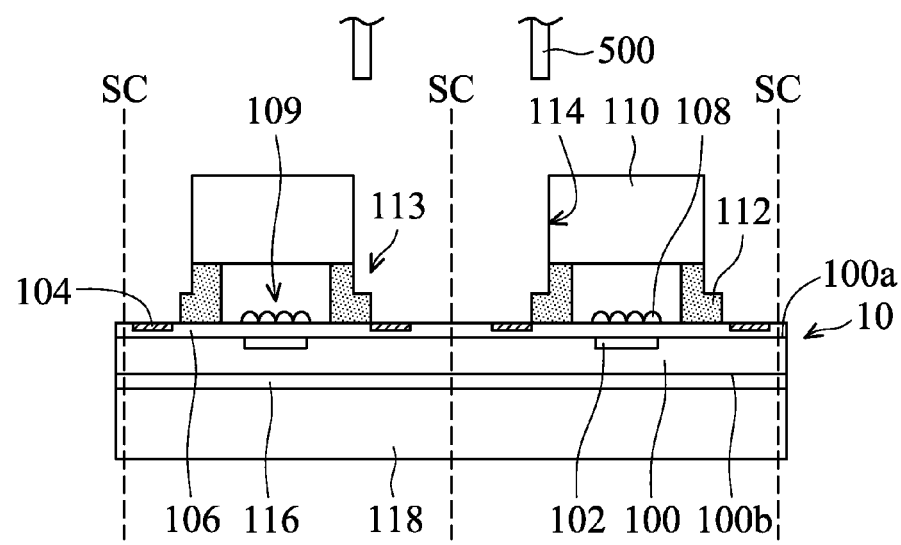

As shown in FIG. 1D, in an embodiment, the wafer 10 may be optionally disposed on the support substrate 118. For example, the wafer 10 may be bonded to the support substrate 118 by an adhesion layer 116. The support substrate 118 may be a semiconductor substrate, a ceramic substrate, a polymer substrate, or a combination thereof. In an embodiment, the support substrate 118 may be a glass substrate. The glass substrate (e.g., having a thickness of 100 μm) does not only function as a support, but can also prevent the formation of a parasitic capacitor between itself and the wafer and can limit RF noise.

Then, a dicing process may be performed along a plurality of scribe lines SC of the wafer 10 for forming a plurality of separated chip packages. The dicing process may be single cutting or segmented cutting processes. As shown in FIG. 1D, a dicing process may be first performed to remove a portion of the cover substrate 110 and expose the wafer 10. In an embodiment, the first dicing process further removes a portion of the spacer layer 112 and forms at least one recession 113 in the spacer layer 112. In an embodiment, a sidewall of the spacer layer 112 (such as a sidewall of the recession 113) may be substantially coplanar with a sidewall of the cover substrate 110. In addition, the first dicing process may comprise using a scribing knife to remove a first portion and a second portion of the cover substrate 110 at different times such that a portion of the cover substrate 110 between the first and second portions of the cover substrate 110 can be separated naturally. For example, a portion of the cover substrate 110 at a left side of the scribe line SC and a portion of the cover substrate 110 at a right side of the scribe line SC are diced at different times such that the middle portion of the cover substrate 110 can be separated naturally. After the first dicing process, an opening 114 exposing the wafer 10 may be formed in the cover substrate 110. However, it should be noted that the embodiments of the present invention are not limited to this. In other embodiments, an opening 114 may be formed by the single cutting process, using a wider scribing knife.

Figure 1E:
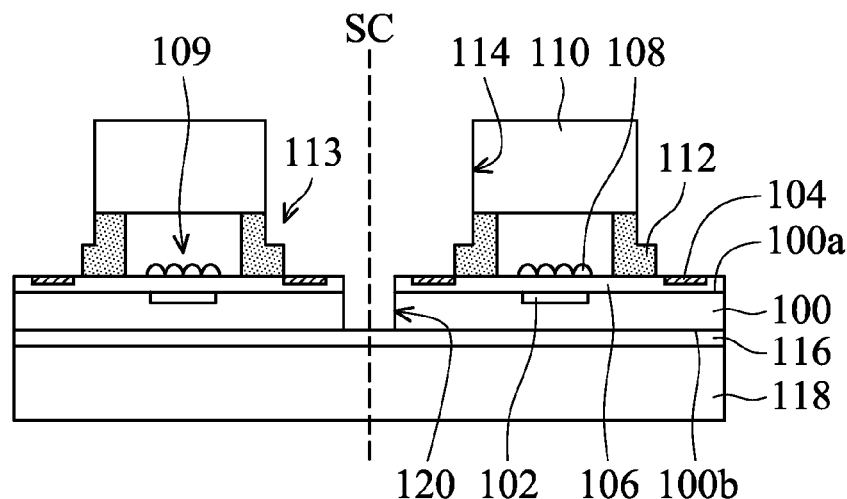
Figure 1F:
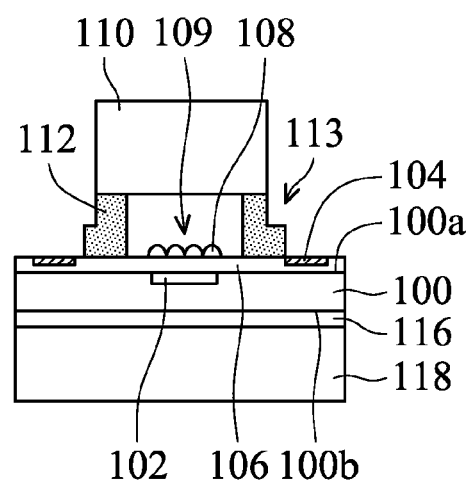

Then, as shown in FIG. 1E, a second dicing process may be performed for removing a portion of wafer 10 and forming a plurality of separated chip packages. Then, the support substrate 118 may be optionally removed. Alternatively, as shown in FIG. 1F, a portion of the support substrate 118 may be removed such that the support substrate 118 underlying the plurality of chip is divided. The chip in the chip packages (diced from the wafer) may comprise the semiconductor substrate 100, the device region 102, the dielectric layer 106 and the conducting pad structure 104. In an embodiment, the sidewall of the support substrate 118 is not coplanar with the sidewall of the chip.

Figure 2A:
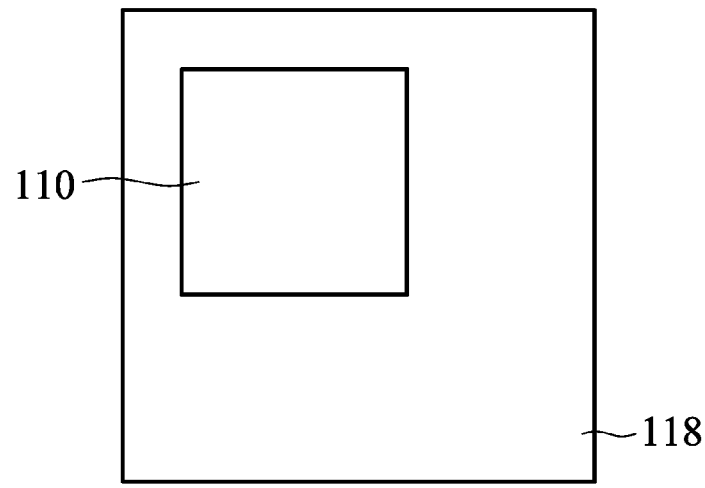
FIGS. 2A-2B show cross-sectional views of the formation of a chip package according to another embodiment of the present invention.
Figure 2B:
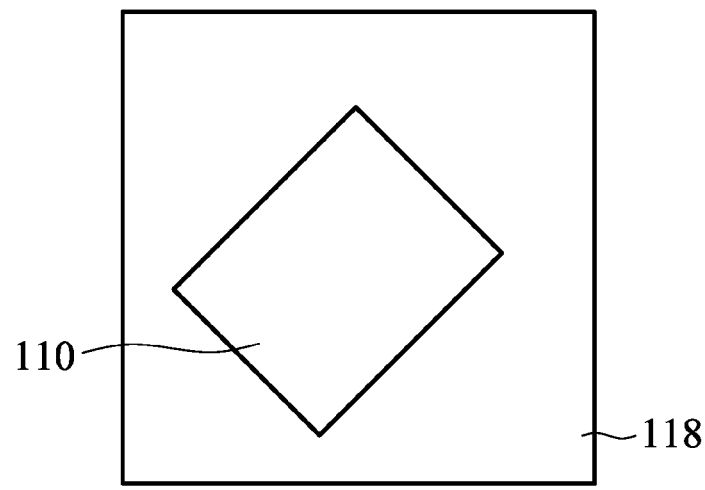

FIGS. 2A and 2B respectively show top views of the chip packages according to the present invention, in which same or similar reference numerals are used to refer to same or similar devices. As shown in FIG. 2A, in an embodiment, the size of the area of the cover substrate 110 of the chip package may be less than that of the support substrate 118. In addition, the central point of the cover substrate 110 may not overlap with the central point of the support substrate 118. That is, the cover substrate 110 may not be disposed at the central area of the support substrate 118. For instance, in the embodiment shown in FIG. 2A, the cover substrate 110 is disposed on the upper left area on the support substrate 118. In another embodiment, as shown in FIG. 2B, the sidewall of the cover substrate 110 may not be parallel to any sidewalls of the support substrate 118.

Figure 3A:
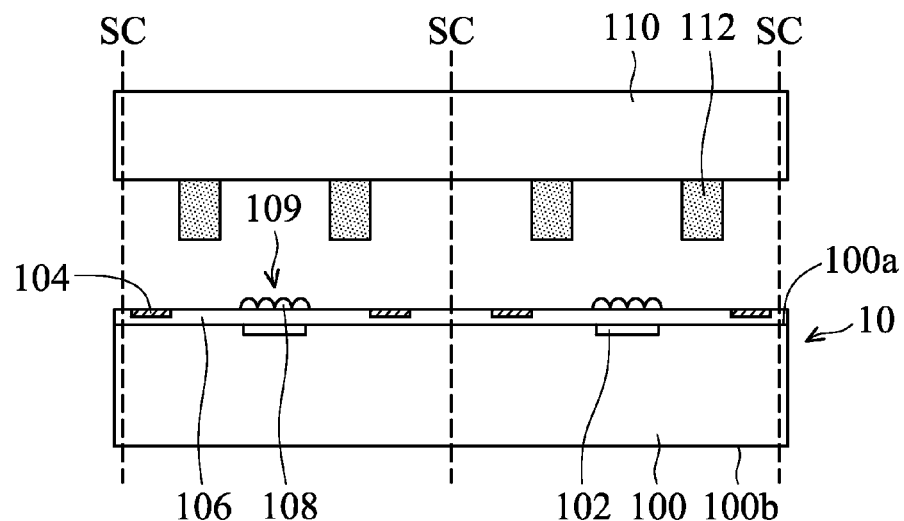
FIGS. 3A-3F show cross-sectional views of chip packages according to embodiments of the present invention.
Figure 3B:
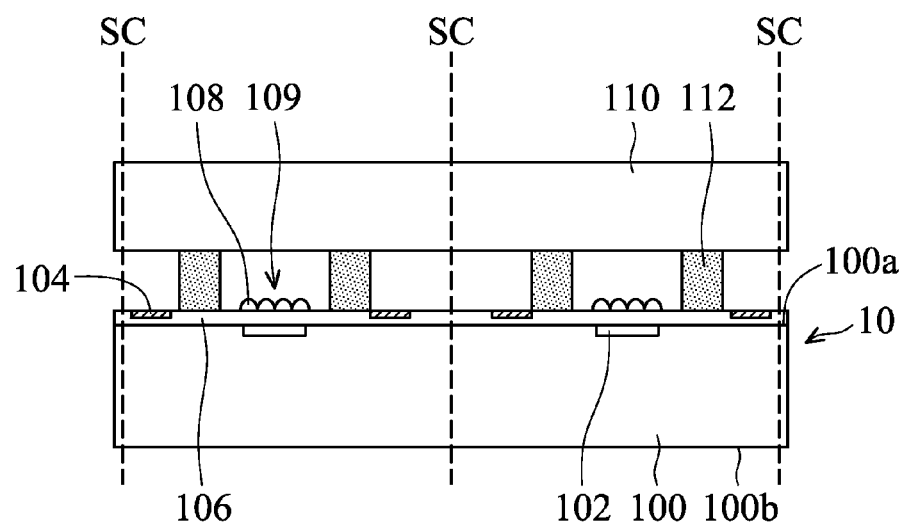
Figure 3C:
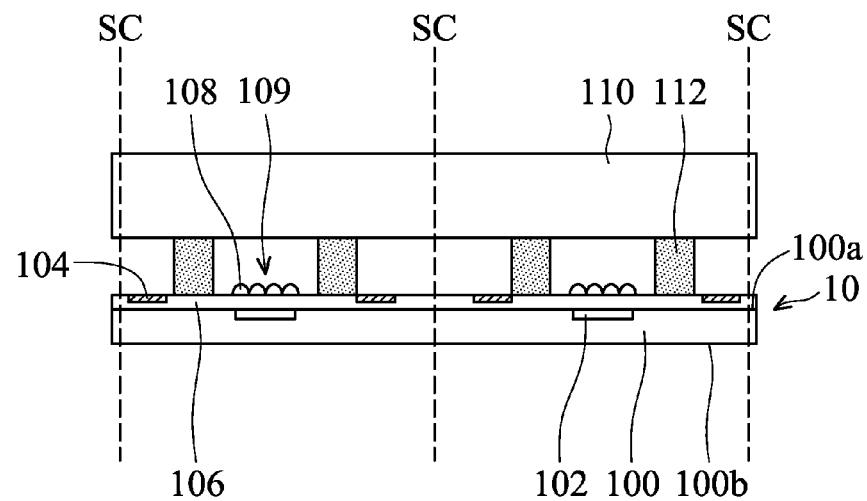
Figure 3D:
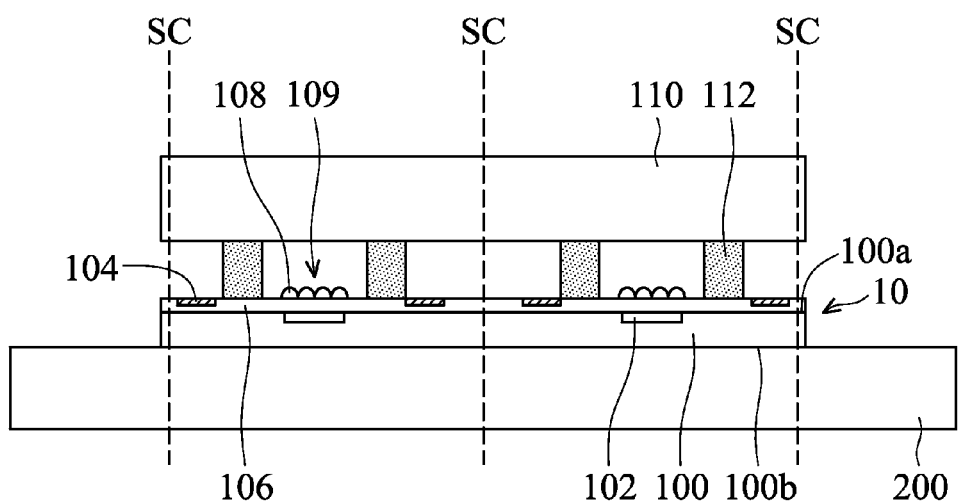

FIGS. 3A-3F show cross-sectional views of the formation of a chip package according to an embodiment of the present invention, in which same or similar reference numerals are used to refer to same or similar devices. As shown in FIGS. 3A-3C, a structure as shown in FIG. 3C is formed by using the steps similar to FIGS. 1A-1C. A wafer 10 may then be optionally disposed on a support substrate. In an embodiment, the support substrate may be a dicing tape 200, as shown in FIG. 3D.

Figure 3E:
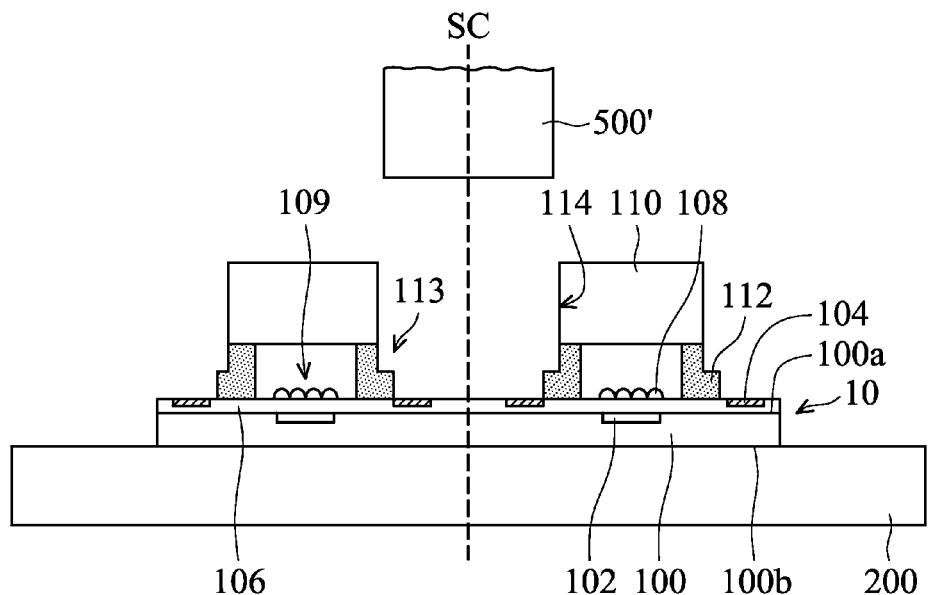

Then, a dicing process may be performed along a plurality of predetermined scribe lines SC of the wafer 10 for forming a plurality of separated chip packages. The dicing process may be single cutting or segmented cutting processes. As shown in FIG. 3E, a first dicing process may be first performed for removing a portion of the cover substrate 100 so as to expose the wafer 10. In an embodiment, the first dicing process further removes a portion of the spacer layer 112 and forms at least one recession 113 in the spacer layer 112. In an embodiment, the sidewall of the spacer layer 112 (for example, the sidewall of the recession 113) may be substantially coplanar with the sidewall of the cover substrate 110. In an embodiment, a wider scribing knife 500' may be used for forming an opening 114 of the wafer 10 by a single cutting process.

However, it should be noted that, the embodiments of the present invention are not limited to this, the first dicing process further comprises dicing a first portion and a second portion of the cover substrate 110 at different times such that a portion of the cover substrate 110 between the first and second portions of the cover substrate 110 may be separated naturally. For example, a portion of the cover substrate 110 at a left side of the scribe line SC and a portion of the cover substrate 110 at a right side of the scribe line SC are diced at different times such that the middle portion of the cover substrate 110 can be separated naturally.

Figure 3F:
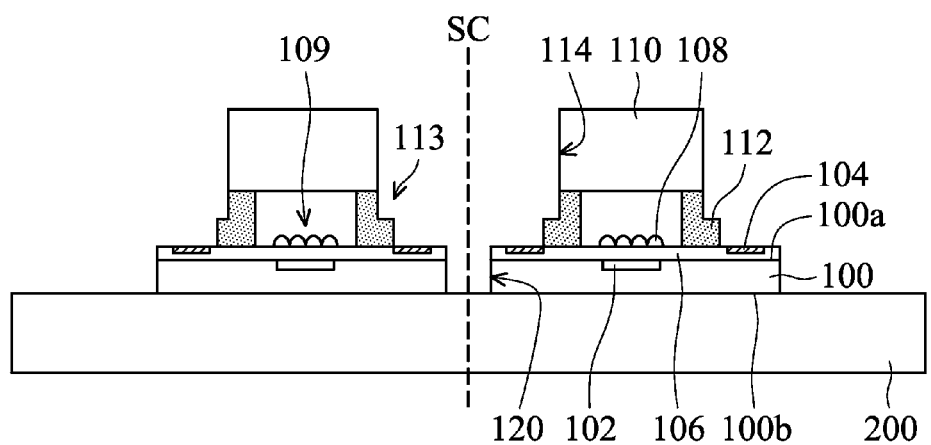

Then, as shown in FIG. 3F, a second dicing process may be performed for removing a portion of the wafer 10 and forming a plurality of separated chip packages. Then, the dicing tap 200 may be optionally removed, and the chip packages are detached.

There are many variations of the embodiments of the present invention. For example, FIGS. 4A-4C show cross-sectional views of chip packages according to embodiments of the present invention, in which same or similar reference numerals are used to refer to same or similar devices.

Figure 4A:
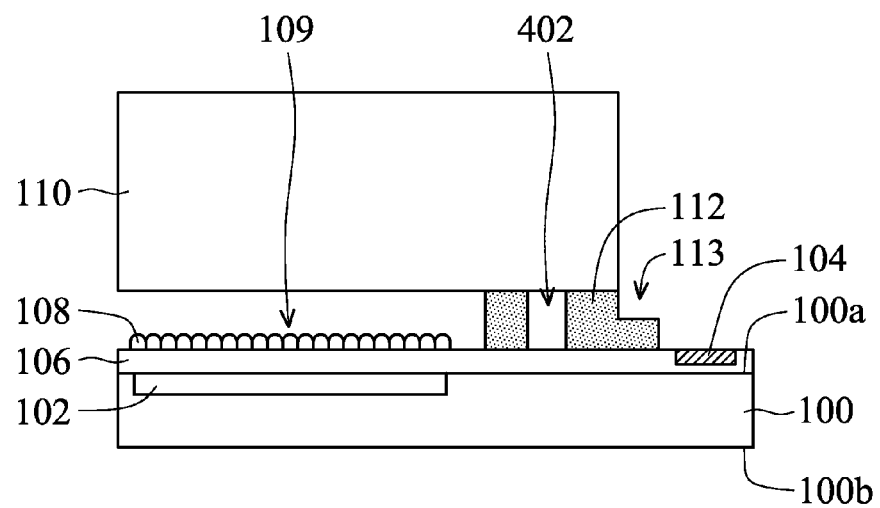
FIGS. 4A-4C show cross-sectional views of chip packages according to embodiments of the present invention.
Figure 4B:
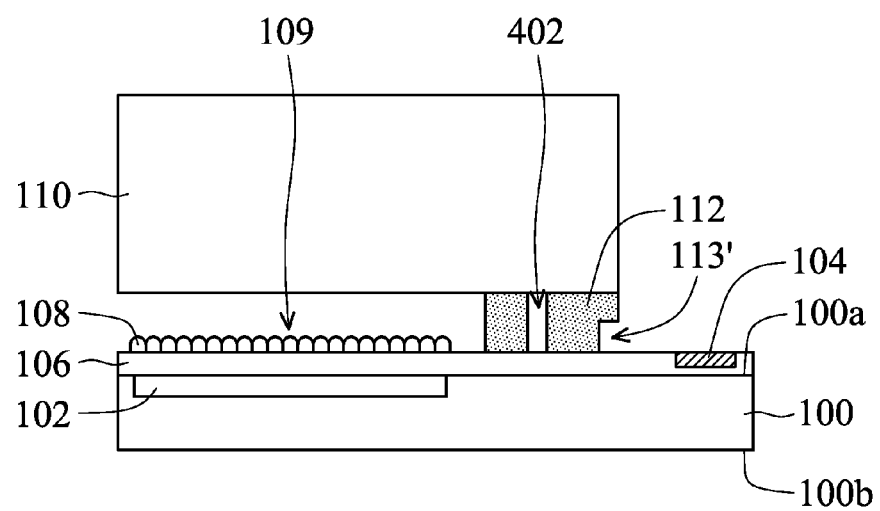
Figure 4C:
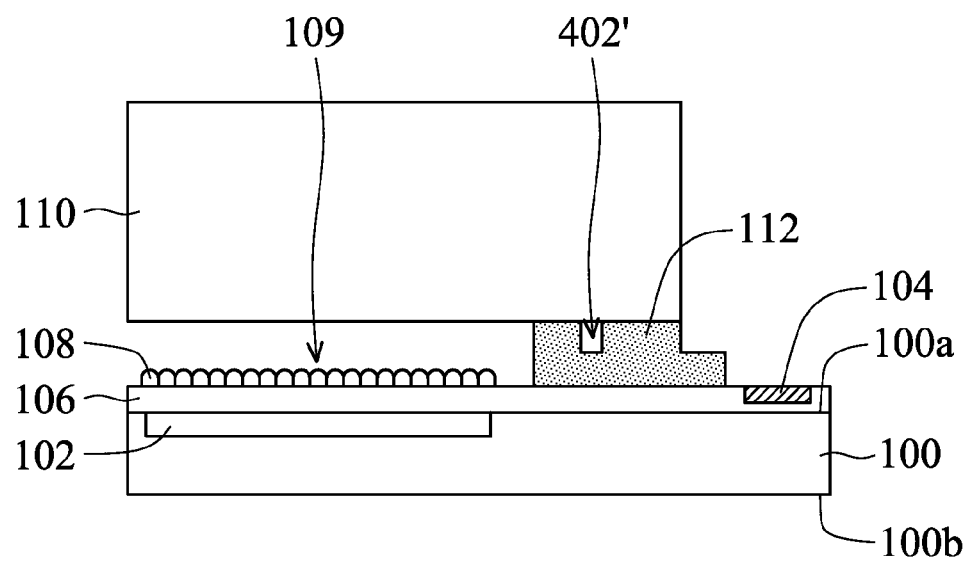

As shown in FIG. 4A, in an embodiment, a hole 402 may be formed in the spacer layer 112. For example, the hole 402 may penetrate through the spacer layer 112. Alternatively, a hole 402' that does not penetrate through the spacer layer 112 may be formed in the spacer layer 402'. As shown in FIG. 4B, the recession 113' of the spacer layer 112 may not be coplanar with the sidewall of the cover substrate 110. The spacer layer 112 may be a stack of a plurality of patterned material layers formed by performing multiple deposition, exposure and development processes. Alternatively, the spacer layer 112 may be a single layer of the patterned spacer material.

In the embodiments of the present invention, the chip package may have a significantly reduced size and can be fabricated in mass production. In addition, the fabrication cost and time may be reduced.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising:
   a chip, comprising:
      a semiconductor substrate having a first surface and a second surface;
      a device region formed in the semiconductor substrate;
      a dielectric layer disposed on the first surface; and
      a conducting pad structure disposed in the dielectric layer and electrically connected to the device region;
   a cover substrate disposed on the chip, wherein a width of the cover substrate is less than that of the chip; and
   a spacer layer disposed between the chip and the cover substrate wherein the spacer layer is made of a non-electrically conductive material, wherein a cavity is created and surrounded by the spacer layer, the chip and the cover substrate on the device region, and wherein the spacer layer directly contacts the chip, and no adhesion glue is disposed between the chip and the spacer layer.

2. The chip package as claimed in claim 1, wherein the cover substrate is a transparent substrate.

3. The chip package as claimed in claim 1, wherein the projection of the spacer layer on the first surface is located between the projection of the conducting pad structure on the first surface and the projection of the device region on the first surface.

4. The chip package as claimed in claim 1, wherein the projection of the spacer layer on the first surface does not overlap the projection of the conducting pad structure on the first surface.

5. The chip package as claimed in claim 1, wherein the spacer layer directly contacts the cover substrate.

6. The chip package as claimed in claim 1, wherein the spacer layer has a recession, and a sidewall of the spacer layer is substantially coplanar with a sidewall of the cover substrate.

7. The chip package as claimed in claim 6, wherein the sidewall of the spacer layer is a sidewall of the recession.

8. The chip package as claimed in claim 6, further comprising a hole in the spacer layer.

9. The chip package as claimed in claim 8, wherein the hole penetrates through the spacer layer.

10. The chip package as claimed in claim 1, further comprising a support substrate disposed on the second surface of the semiconductor substrate.

11. The chip package as claimed in claim 10, wherein a sidewall of the support substrate is not coplanar with a sidewall of the chip.

12. The chip package as claimed in claim 11, wherein the support substrate is a glass substrate.

13. The chip package as claimed in claim 1, further comprising an optical element disposed on the device region and in the cavity.

14. The chip package as claimed in claim 1, wherein the spacer layer directly contacts the semiconductor substrate, the dielectric layer, an optical layer on the semiconductor substrate or a flat layer on the semiconductor substrate of the chip.

15. The chip package as claimed in claim 1, wherein the spacer layer comprises a stack of a plurality of material layers.

16. A chip package, comprising:
a chip, comprising:
a semiconductor substrate having a first surface and a second surface;
a device region formed in the semiconductor substrate;
a dielectric layer disposed on the first surface; and
a conducting pad structure disposed in the dielectric layer and electrically connected to the device region;
a cover substrate disposed on the chip, wherein the size of the area of the cover substrate is less than that of the support substrate; and
a spacer layer disposed between the chip and the cover substrate wherein the spacer layer is made of a non-electrically conductive material, wherein a cavity is created and surrounded by the spacer layer, the chip and the cover substrate on the device region, and wherein the spacer layer directly contacts the chip, and no adhesion glue is disposed between the chip and the spacer layer.

17. The chip package as claimed in claim 16, wherein a sidewall of the cover substrate is not parallel to any sidewalls of the support substrate.

18. The chip package as claimed in claim 16, wherein a central point of the cover substrate does not overlap with a central point of the support substrate.

19. A method for forming a chip package, comprising:
providing a wafer, comprising:
a semiconductor substrate having a first surface and a second surface;
a plurality of device regions formed in the semiconductor substrate;
a dielectric layer disposed on the first surface; and
a plurality of conducting pad structures disposed in the dielectric layer, wherein each of the conducting pad structures is electrically connected to one of the device regions, respectively;
providing a cover substrate;
forming a spacer layer on the wafer or the cover substrate wherein the spacer layer is made of a non-electrically conductive material;
mounting the cover substrate onto the wafer such that the spacer layer is located between the wafer and the cover substrate, wherein a plurality of cavities is created and surrounded by the spacer layer, the wafer and the cover substrate, and each of the cavities is located over one of the device regions, respectively, and wherein the spacer layer directly contacts the wafer, and there is no adhesion glue disposed between the wafer and the spacer layer; and
performing a dicing process along a plurality of predetermined scribe lines of the wafer for forming a plurality of separated chip packages, wherein the dicing process comprises: performing a first dicing process for removing a portion of the cover substrate and exposing the wafer; and providing a second dicing process for removing a portion of the wafer for forming the chip packages, wherein a width of the cover substrate is less than that of the wafer of the chip packages.

20. The method for forming a chip package as claimed in claim 19, further comprising mounting the wafer onto a support substrate before the dicing process.

21. The method for forming a chip package as claimed in claim 20, wherein the support wafer comprises a glass substrate.

22. The method for forming a chip package as claimed in claim 20, wherein the support substrate comprises a dicing tape.

23. The method for forming a chip package as claimed in claim 20, further comprising thinning the wafer before mounting the wafer onto the support substrate.

24. The method for forming a chip package as claimed in claim 19, wherein the first dicing process further removes a portion of the spacer layer and forms at least one recession in the spacer layer.

25. The method for forming a chip package as claimed in claim 24, wherein the sidewall of the at least one recession is substantially coplanar with a sidewall of the cover substrate.

26. The method for forming a chip package as claimed in claim 24, wherein the first dicing process comprises removing a first portion and a second portion of the cover substrate at different times such that a portion of the cover substrate between the first portion and the second portion of the cover substrate is separated naturally.

27. The method for forming a chip package as claimed in claim 19, wherein the step of forming the spacer layer comprises performing multiple deposition, exposure and development processes, for forming a stack of a plurality of patterned material layers.

* * * * *